United States Patent [19]
Hooper et al.

[11] Patent Number: 5,222,029
[45] Date of Patent: Jun. 22, 1993

[54] BITWISE IMPLEMENTATION MECHANISM FOR A CIRCUIT DESIGN SYNTHESIS PROCEDURE

[75] Inventors: Donald F. Hooper, Northboro; Snehamay Kundu, Marlboro, both of Mass.

[73] Assignee: Digital Equipment Corporation, Maynard, Mass.

[21] Appl. No.: 988,381

[22] Filed: Dec. 8, 1992

Related U.S. Application Data

[63] Continuation of Ser. No. 698,335, May 7, 1991, abandoned, which is a continuation of Ser. No. 393,100, Aug. 3, 1989, abandoned, which is a continuation of Ser. No. 907,516, Sep. 12, 1986, abandoned.

[51] Int. Cl.$^5$ ............... G06F 15/60; G06F 15/40
[52] U.S. Cl. .................... 364/489; 364/488; 395/54; 395/600
[58] Field of Search ............ 364/488, 489, 490, 491; 395/10, 54, 600, 921

[56] References Cited

U.S. PATENT DOCUMENTS

| T935,003 | 6/1975 | Linville et al. | 364/490 |
|---|---|---|---|
| 4,377,849 | 3/1983 | Finger et al. | 364/491 |
| 4,386,403 | 5/1983 | Hsieh et al. | 364/300 |
| 4,510,616 | 4/1985 | Lougheed et al. | 364/490 |
| 4,554,631 | 11/1985 | Reddington | 364/300 |
| 4,584,653 | 4/1986 | Chih et al. | 364/488 |
| 4,613,940 | 9/1986 | Shenton et al. | 364/488 |
| 4,703,435 | 10/1987 | Darringer et al. | 364/488 |

FOREIGN PATENT DOCUMENTS

| 0168650 | 1/1986 | European Pat. Off. | 364/489 |
|---|---|---|---|
| 1445914 | 8/1976 | United Kingdom | 364/490 |

OTHER PUBLICATIONS

"Quality of Designs from an Automatic Logic Generator (ALERT)", Friedman et al., 7th DA conference 1970, pp. 71-89.

"LORES—Logic Reorganization System", Nakamura et al., 15th DA Conference 1978, pp. 250-260.

"A New Look at Logic Synthesis", Darringer et al., 17th DA Conference 1980, pp. 543-549.

"Methods Used in an Automatic Logic Design Generator (ALERT)", Friedman et al., IEEE—Computer, vol. C-18, No. 7, Jul. 1969, pp. 593-610.

"Logic Synthesis Through Local Transformations", Darringer et al., IBM Journal, vol. 25, No. 4, Jul. 1981, pp. 272-280.

D. L. Dietmeyer, "Logic Design of Digital Systems", Allynt Bacon, Boston 1978, pp. 156-238.

(List continued on next page.)

Primary Examiner—Vincent N. Trans
Attorney, Agent, or Firm—Kenneth F. Kozik; Denis G. Maloney; Barry N. Young

[57] ABSTRACT

In a procedure for synthesizing circuit designs, a SYNTHESIZE command in a consequence portion of a rule can be used to control the creation of bit-level instances from a description of a more abstract instance whose interface consists of multi-bit signals. The 'synthesize' command has a form that identifies multibit signal/part objects in the data base relative to the current multi-bit instance, which are then synthesized over the range of most-significant to least significant bit. A collection of rules, called macrorules are enclosed within a 'synthesize' command. An iteration controlled by "current bit", ranging from least significant to most significant bit, ensues. At each step of the iteration, all macrorules are tested and applied if they are 'true'. The macrorules can query whether the current bit is a function of the least or most significant bits. The macrorules can also establish connectivity to any signal bit relative to the current, the least significant or the most significant bit. Signals which represent numeric constants, are converted to the correct binary value for each bit of the bitwise synthesis. During this process, new signal names with bit subscripts are generated, if needed, and connections are made so that the resulting data base represents an electrically connected circuit.

7 Claims, 10 Drawing Sheets

OTHER PUBLICATIONS

Daniel et al., "CAD Systems for IC Design", IEEE Computer-Aided Design of Integrated Circuits and Systems, vol. CAD-1, No. 1, Jan. 1982, pp. 2-11.

Trimberger, "Automating Chip Layout", IEEE Spectrum, vol. 19, No. 6, Jun. 1982, pp. 38-45.

Franco et al., "The Cell Design System", IEEE 18th Design Automation Conference, paper 12.4, 1981, pp. 240-247.

Kessler et al., "Standard Cell VLSI Design: A Tutorial", IEEE Circuits and Devices Magazine, Jan. 1985, pp. 17-34, cited in U.S. patent application Ser. No. 907,303.

C. L. Forgy, "OPS5 User's Manual," Carnegie-Mellon University (Jul., 1981).

K. J. Lieberherr, "Toward a Standard Hardware Description Language," IEEE Design & Test of Computers, vol. 2, No. 1, pp. 55-62 (Feb., 1985).

T. Saito et al., "A Rule-Based Logic Circuit Synthesis System for CMOS Gate Arrays," 23rd ACM/IEEE Design Automation Conference, Paper 34.1, pp. 594-600 (Jun. 29-Jul. 2, 1986).

A. Parker, "Automated Synthesis of Digital Systems," IEEE Design and Test of Computers, vol. 1, No. 4, pp. 75-81 (Nov., 1984).

BITWISE IMPLEMENTATION MECHANISM FOR A CIRCUIT DESIGN SYNTHESIS PROCEDURE

This application is a continuation of application Ser. No. 07/698,335, filed May 7, 1991 which was a continuation of application Ser. No. 07/393,100, filed Aug. 3, 1989 which was a continuation of application Ser. No. 06/907,516, filed Sep. 12, 1986, all now abandoned.

RELATED PUBLICATIONS

The following publications and U.S. Patent Applications are related documents to the instant Application:

Managing the Chip Design Database, by Randy H. Katz, IEEE Computer, Vol. 16, No. 12, December 1983, pages 26 through 35.

Common LISP: The Language, by Guy L. Steele Jr. 1984, The Digital Press, Maynard, Mass., U.S.A.

Procedure and Data Structures for Synthesis and Transformation of Logic Circuit Designs, invented by Donald F. Hooper et al., assigned to the same assignee named herein, having U.S. Ser. No. 907,303, filed Sep. 12, 1986, now abandoned.

Data Base Access Mechanism for Rules Utilized by a Synthesis Procedure for Logic Circuit Design, invented by Donald F. Hooper, assigned to the same assignee named herein, having U.S. Ser. No. 907,515, filed Sep. 12, 1986, now abandoned.

Rule Structure for Insertion of New Elements in a Circuit Design Synthesis Procedure, invented by Donald F. Hooper et al., assigned to the same assignee named herein, having Ser. No. 907,513, filed Sep. 12, 1986, now abandoned.

Rule Structure In a Procedure for Synthesis of Logic Circuit Designs, invented by Donald F. Hooper et al, assigned to the same assignee named herein, having U.S. Ser. No. 907,512, filed Sep. 12, 1986, now abandoned.

BACKGROUND OF THE INVENTION

1. Field of the Invention

This invention relates generally to the synthesis of circuit designs and, more particularly, to the replacement of circuit components having a high level (abstract) representation with the a more fundamental binary bit level representation.

2. Description of the Related Art

In the usual circuit design synthesis procedures, simple instance replication is used to produce a number of copies of a abstract multibit instance (or data base object) in which the pins of each copy are assigned a bit position of a multibit vector. Similarly, a simple loop procedure can produce copies of a data base object to effectively instantiate or replicate a multibit entity at the bit level. Such loop procedures do not have the flexibility to synthesize any but standard circuit entities.

Referring next to FIG. 1, the procedure for synthesizing a logic circuit design according to the prior art is shown. Model definition data structures from a library of component definitions are entered into the data structures associated with the synthesis data base in step 11. In step 12, the information related to the instances of the circuit design including the connectivity information is entered in the data base. The instances of the circuit design are generally in a behavioral or functional form when entered in the synthesis data base. The synthesis procedure relates the instances of the circuit design to the model instances in step 13. In step 14, a set of rules for the synthesis procedure is applied to each of the model instances and the model instances are altered and connected in such a way as to maximize certain parameters such as size, path delay, power, etc. In step 15, the resulting circuit design is placed in a format that can control the automated fabrication of the circuit.

FEATURES OF THE INVENTION

It is an object of the present invention to provide an improved design circuit synthesis procedure.

It is a feature of the present invention to provide an improved technique for replacing high level representation of circuit components in a circuit design with bit level representations of the components.

It is yet another feature of the present invention to provide an iterative procedure for replacing complex data base objects with a plurality of bit level data base objects.

SUMMARY OF THE INVENTION

The aforementioned and other features are obtained, according to the present invention, by providing a procedure for creating bit-level model instances for replacing of higher level multi-bit model instances. The procedure includes a format in the consequence portion of a rule that permits flexibility in the creation of the bit-level model instances. The bit-level model instances can be a function of the least significant, most significant or current bit. The high level (abstract) model instances can have multibit ports input and output signal, with unequal ranges.

These and other features of the present invention will be understood upon reading of the following description along with the drawings.

DESCRIPTION OF THE PREFERRED EMBODIMENT

1. Detailed Description of the Figures

Figure 1:
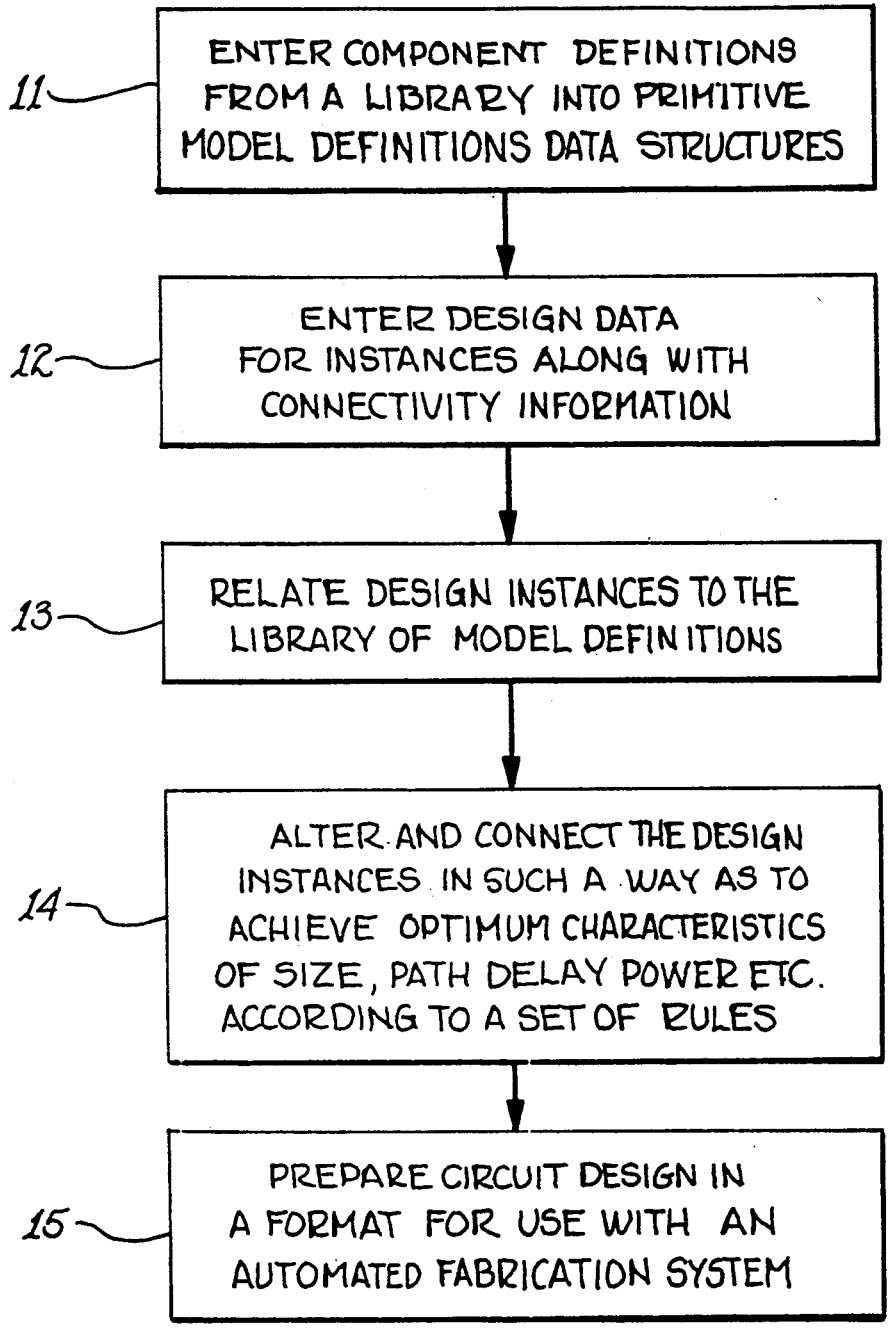
FIG. 1 is a flow diagram illustrating a procedure for synthesizing circuit designs according to the related art.

FIG. 1 has been previously described in relationship to the related art.

Figure 2:
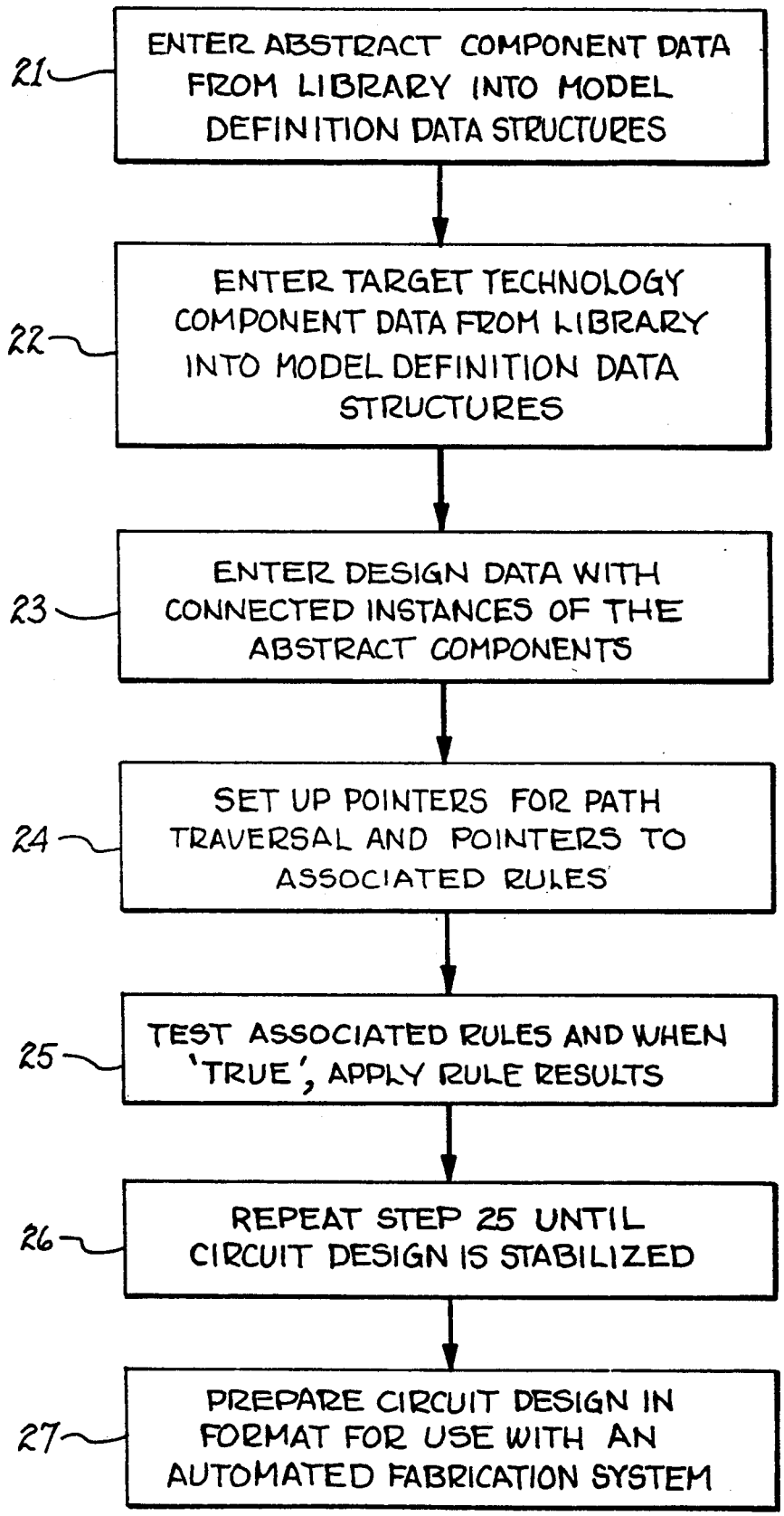
FIG. 2 is a flow diagram illustrating a procedure for synthesizing circuit designs with which the present invention is intended to be used.

Referring next to FIG. 2, the synthesis procedure of the present invention is shown. In step 21, abstract component data from a library of such data is entered into model definition data structures of the synthesis procedure. In step 22, component data from the library relating to the target technology is entered into model definition data structures of the synthesis procedure. The circuit design data, with the connected instances described in terms of abstract components, is entered into the synthesis procedure in step 23. In step 24, the synthesis procedure provides two sets of pointers. The first set of pointers permits the synthesis procedure to follow any arbitrary path through the design circuit. The second set of pointers couples rules with associated data base structures. In step 25, the associated rules are tested for each model instance and when the test provides a 'true' result, the consequences of the rule is implemented. In the preferred embodiment, each rule has an antecedent portion and a consequence portion. The antecedent portion includes a test algorithm, and the consequence portion provides the information required to implement a result of the test. Because the rules are applied to instances in a sequential manner, and because in the preferred embodiment the test procedures can involve neighboring instances that are changed as a result of a test applied to that instance, the process is repeated until the circuit design has stabilized. In step 27, the final version of the circuit design is placed in a format suitable for use in an automated circuit fabrication system.

Figure 3:
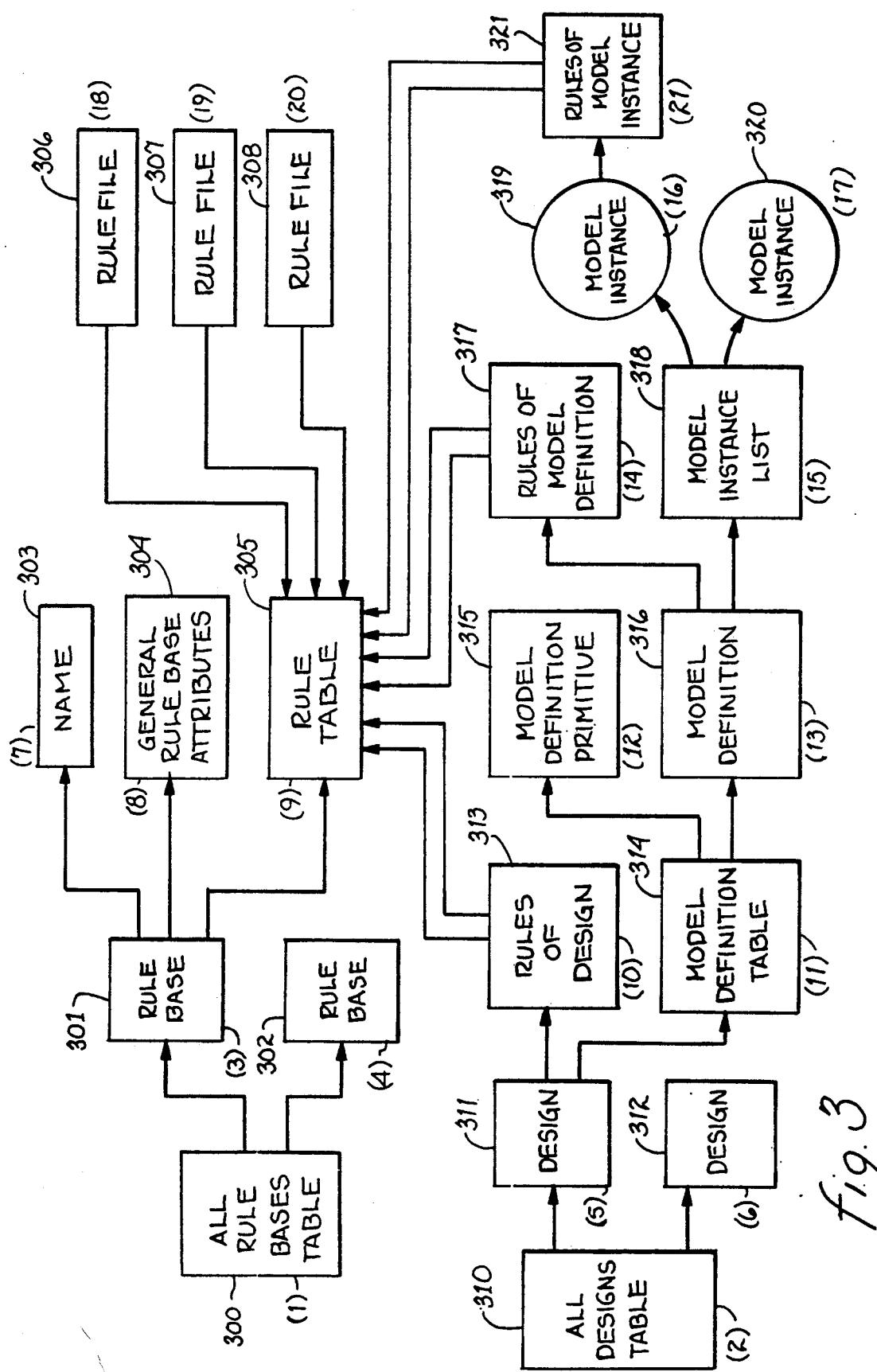
FIG. 3 is an overall diagram of the architecture for data structures of logic design and logic synthesis rules.

Referring now to FIG. 3, the architectural organization for the storage of the logic synthesis rules and the logic design rules are shown. Two storage hierarchies are available, one representing rule information and the second representing digital design information. These information hierarchies interact when pointers are established, relating the design objects to specific groups of rules. A rule file 306 through 308 is a collection of rules arbitrarily organized by the creator of the file. Several rule files can be transferred to a rule table 305. The rule table 305 is a lookup table that is indexed by the name of the rules stored therein. The rule table 305 is an attribute of a rule base 301 that has in addition to the rules stored in rule table 305, a name 303 and other attributes 304 of the rule base 301. Any number of rule bases 301 through 302 are contained in the table of all rule bases 300. The all rule bases table 300 is a lookup table indexed by the name of the rule base. The all rule base table 300 is the top of the rule information hierarchy. The logic design data is partitioned into blocks, called model definitions 315 through 316. Any number of model definitions can be stored in the model definition table 314, a lookup table indexed by the model name. A model definition can contain a model instances list 318 that includes model instances 319 and 320 and that are model instances to other model definitions. For any functional part type or structural body of a given name, only one model definition can exist. However, any functional part type or structural body can have zero or more model instances. The attributes of the model definition are common to all of the instances associated therewith and, therefore, need to be stored only with the model definition. The model definition contains "LIBRARY" information. The attributes of the model instances, such as timing parameters and simulation values are unique to each model instance and consequently must be stored with the associated instance. Those model definitions with no model instances or for which a "LIBRARY" attribute is specified are considered primitive model definitions and are stored in table 315. The model definition table 314 is stored in a design table 311, the design being table capable of possessing other attributes. Any number of designs 311 through 312 can be contained in the all designs table 310.

Figure 4:
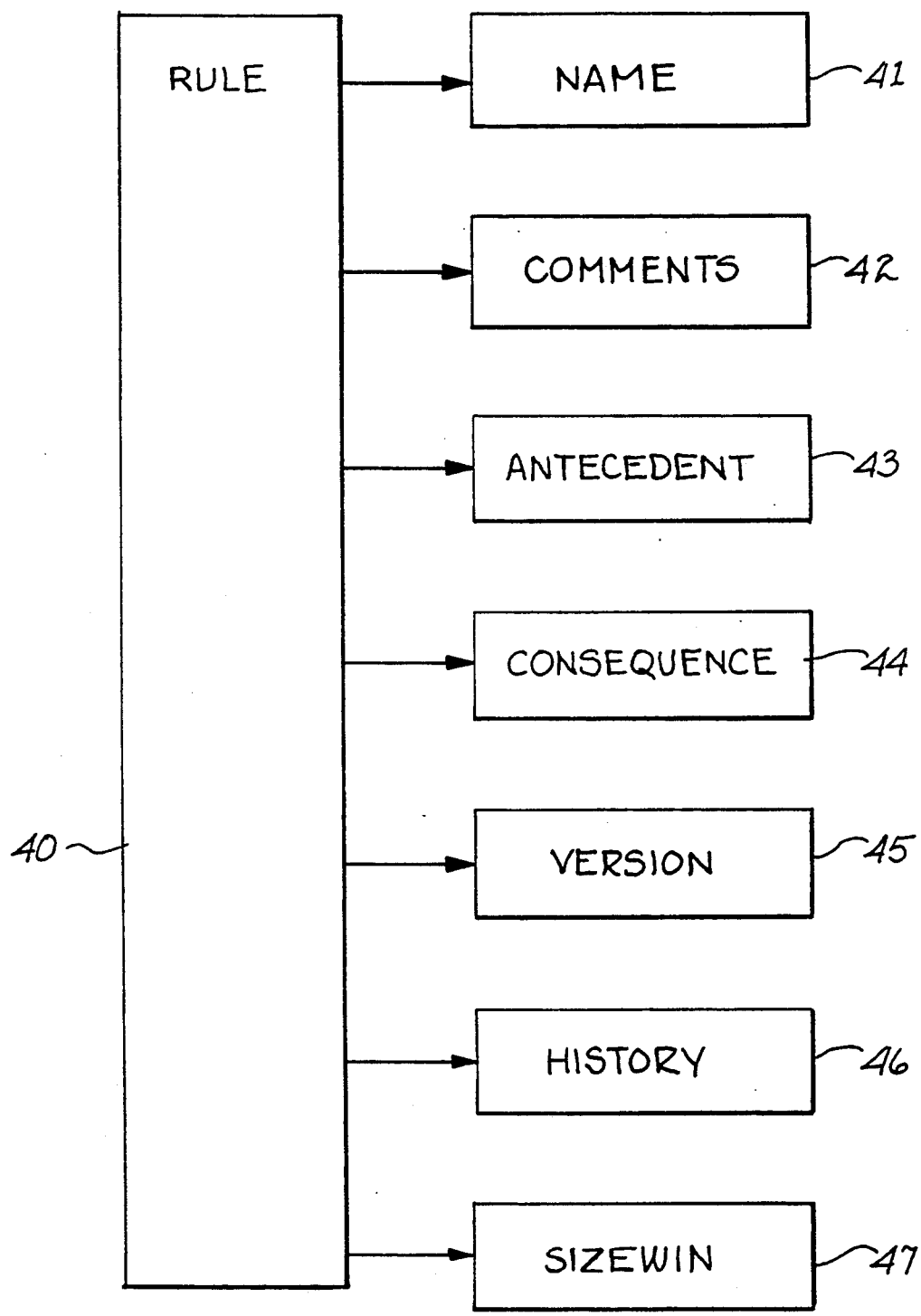
FIG. 4 is an illustration of the structure of a rule file according to the present invention.

Referring next to FIG. 4, the general structure of a rule 40 used in the logic network synthesis is shown. At rule file read time, the structure is created for each rule 40. A location in the file is reserved for the name field 41 of the rule. Another location is reserved for comments file 42 which are formal comments concerning the use of the rule. Antecedent field 43, consequence field 44, version field 45, history field 46 and sizewin field 47 are contains fields within the rule structure. The antecedent field 43 and the consequence field 44 are described below. The version field 45 includes version information from a host computer aided design (CAD) data management system, when available, or time_of_day and date information, when available. The history field 46 is initially set to zero and is subsequently used to keep a running count of the number of times the associated rule is applied.

Figure 5:
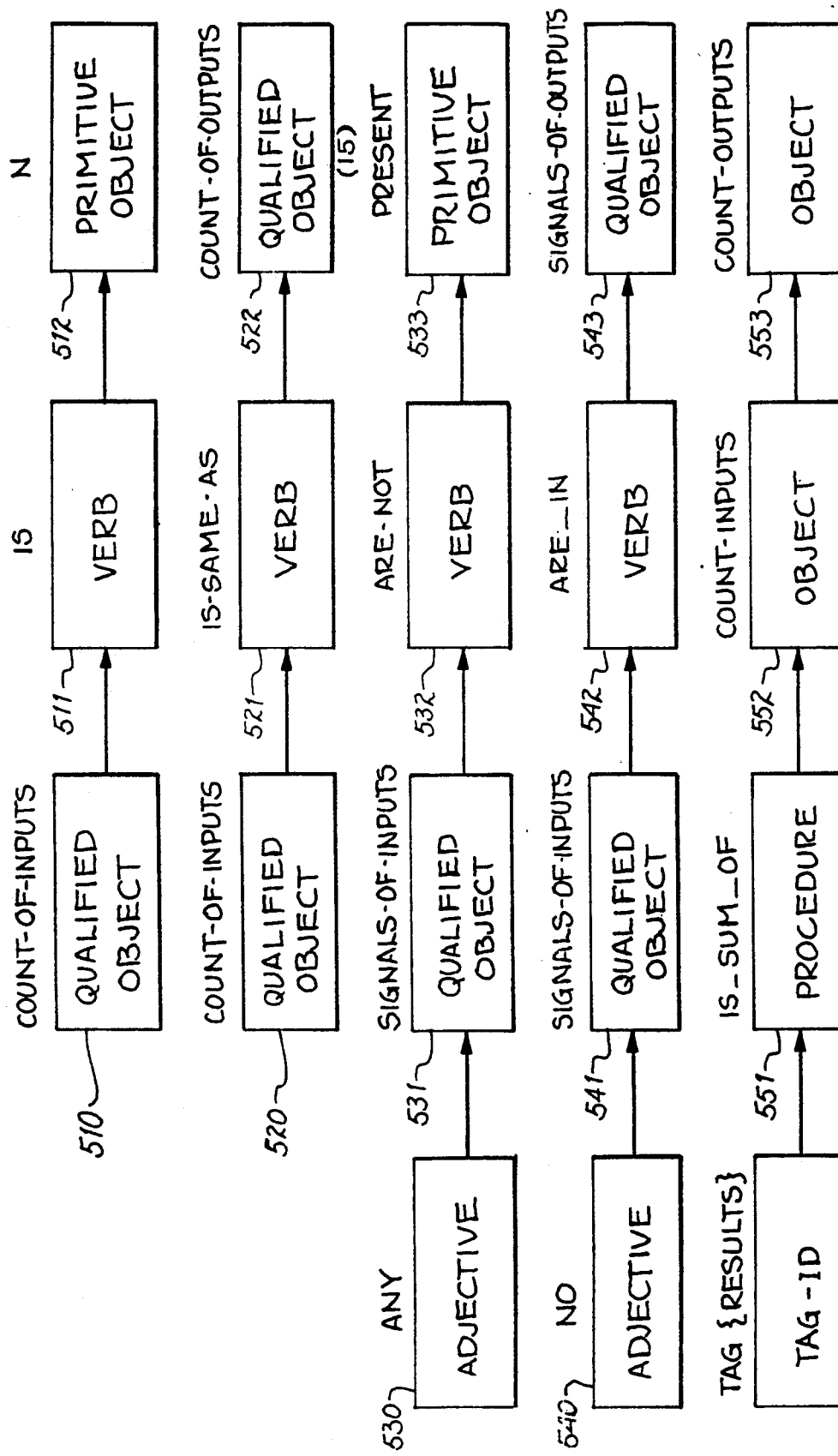
FIG. 5 illustrates the forms of an antecedent portion of the rule file according to the present invention.

Referring to FIG. 5, five examples of the antecedent field 43 of the rule structure of FIG. 4 are shown. In these examples, a qualified object is a database object at the end of an access chain in the data base for which the beginning is a current instance. A qualified object may also be a plurality of qualified objects. A primitive is taken as is without further database access (e.g. a number is a primitive object). in the first example, (count_of_inputs is N), the qualified object 510 is followed by a verb 511 followed by a primitive object 512. The meaning of this field is that if the current instance has N inputs, then this antecedent will return 'true' (T) when evaluated, otherwise, the antecedent will return 'nil' when evaluated.

In the second example, (count_of_inputs is_same_as count_of_outputs), the qualified object 520 is followed by a verb 521 which in turn is followed by a qualified object 522.

In the third example, (any signals_of_inputs are_not present), an adjective 530 is followed by a qualified object 531, which in turn is followed by a verb 532, which in turn is followed by primitive object 533. This field is interpreted as follows: when any of the inputs of the current instance is not coupled to a signal, the antecedent will return a 'true' value.

In example four, (no signals_of_inputs are_in signals_of_outputs), an adjective 540 is followed by a qualified object 541, which in turn is followed by a verb 542, which is in turn followed by a qualified object 543.

In the fifth example, (tag{result} is_sum_of count_inputs count_outputs), a value{result} 550 is stored that is the result of a called procedure 551 with an arbitrary number of arguments 552, 553 et al. This procedure call permits LISP functions to be used by a rule antecedent field. The arguments 552, 553 et al. can be primitive objects or qualified objects. The tag {result} can be used during the remainder of the rule antecedent field procedure and consequence field procedures to fetch the value stored under that name. The number of tags is not limited and all tag storage is erased when the antecedent portion of the rule is false or at the completion of the consequence portion of the rule. This type of antecedent always returns a 'true' (T) value, regardless of the value of the tag field. In the preferred embodiment, it is possible to use keywords (tag1, tag2, etc.) and to refer to them directly as in the expressions:

(tag {result} is—sum—of count—inputs count—outputs)
({result} is—less—than N)
which can also be expressed:
(tag1 is—sum—of count—inputs count—outputs)
(tag1 is—less—than N)
Rule antecedents can also be nested by using the boolean terms 'AND' or 'OR'. This nesting can be done in LISP format. For example:
(or (count—ins is—less than N)
({result} is—less than N))

Figure 6:
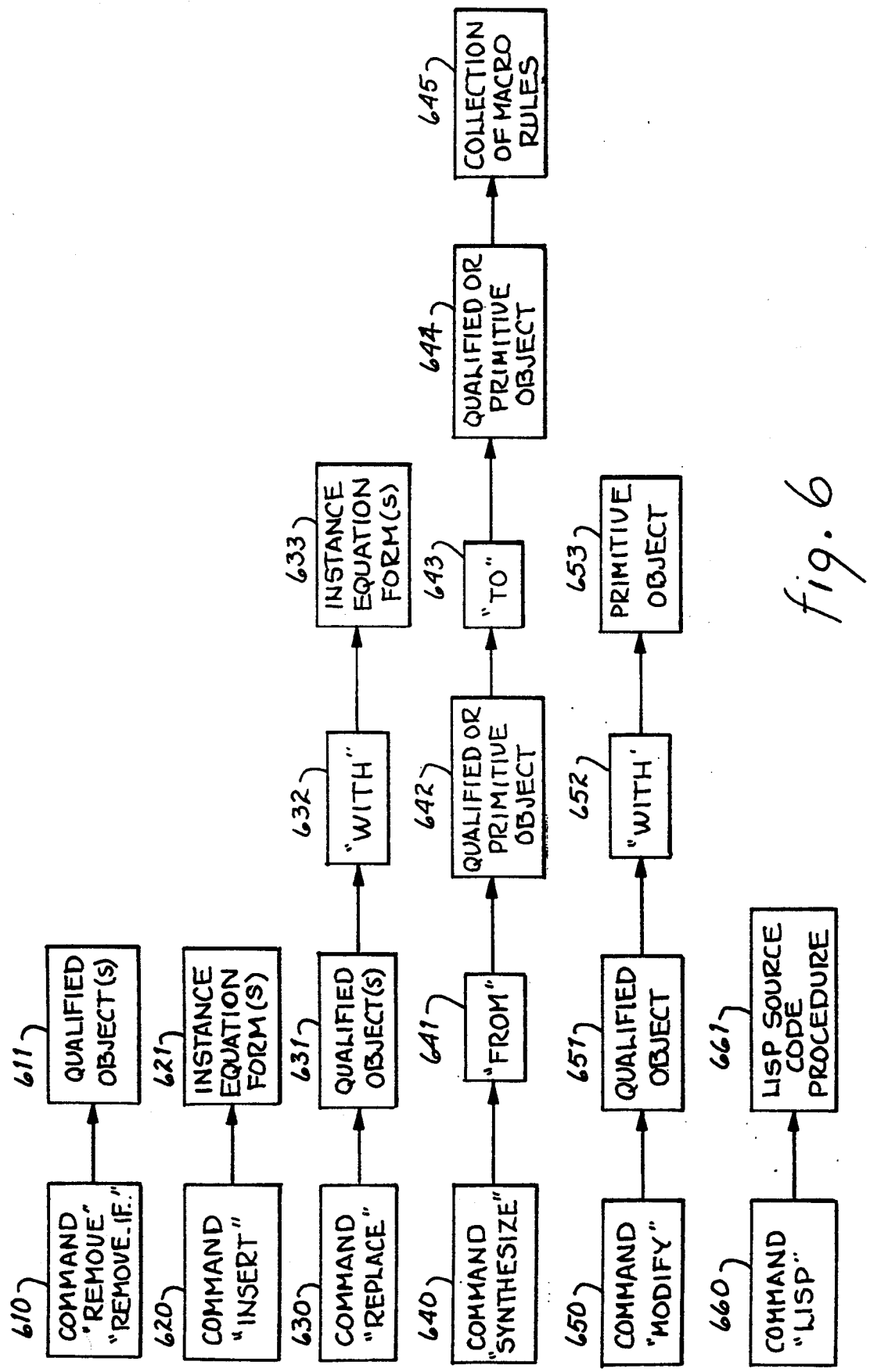
FIG. 6 illustrates the forms of a consequence portion of the rule file according to the present invention.

Referring next to FIG. 6, the structure of the consequence field of the rule is illustrated by six examples. In the first example, the command "remove" or "remove—if—no—dests" 610 is used to remove one or more instances 611 from the instances of the current model definition.

In the second example of FIG. 6, the "insert" command 620 is used to perform the reverse of the 'remove' command 610. The argument to the 'insert' command is a suitable equation form 621 with optional settings of database attributes to the instances being inserted. The insertion of a model instance is described in detail in the co-pending Patent Application entitled "Rule Structure for Insertion of New Elements in a Circuit Design Synthesis Procedure" identified above.

The third example illustrates the 'replace' command 603. This command is a combination of the 'remove' and the 'insert' commands to remove one or more qualified model instance objects 631 and then to insert one or more model instance objects derived from equation form 633.

The fourth example of FIG. 6 illustrates the form of the 'synthesize' command 640. This command is used for complex multibit synthesis in which the current instance operated upon by the rule has the attributes of most significant bit and least significant bit, as is common in high level specifications of digital designs. An example of such a device is a 32 bit incrementer, which can have a most significant bit of 31 and a least significant bit of 0. Following the 'synthesize' command is the keyword 'from' 641, followed by access to the most significant bit 642. The most significant bit 642 is followed the keyword 'to', followed by access to the least significant bit 644 and finally followed by a collection of rules 645.

The fifth example of FIG. 6 identifies the form of the 'modify' command 650. This command is used to alter a database object by setting its value. The 'modify' keyword is followed by a qualified object 651, the qualified object being followed by the keyword 'with' 652. The keyword 'with' is then followed by a primitive object 653. The sixth example of FIG. 6 uses the 'LISP' keyword to permit entry of a LISP procedural expression 661. This procedural capability provides additional flexibility to modify the design database.

Figure 7:
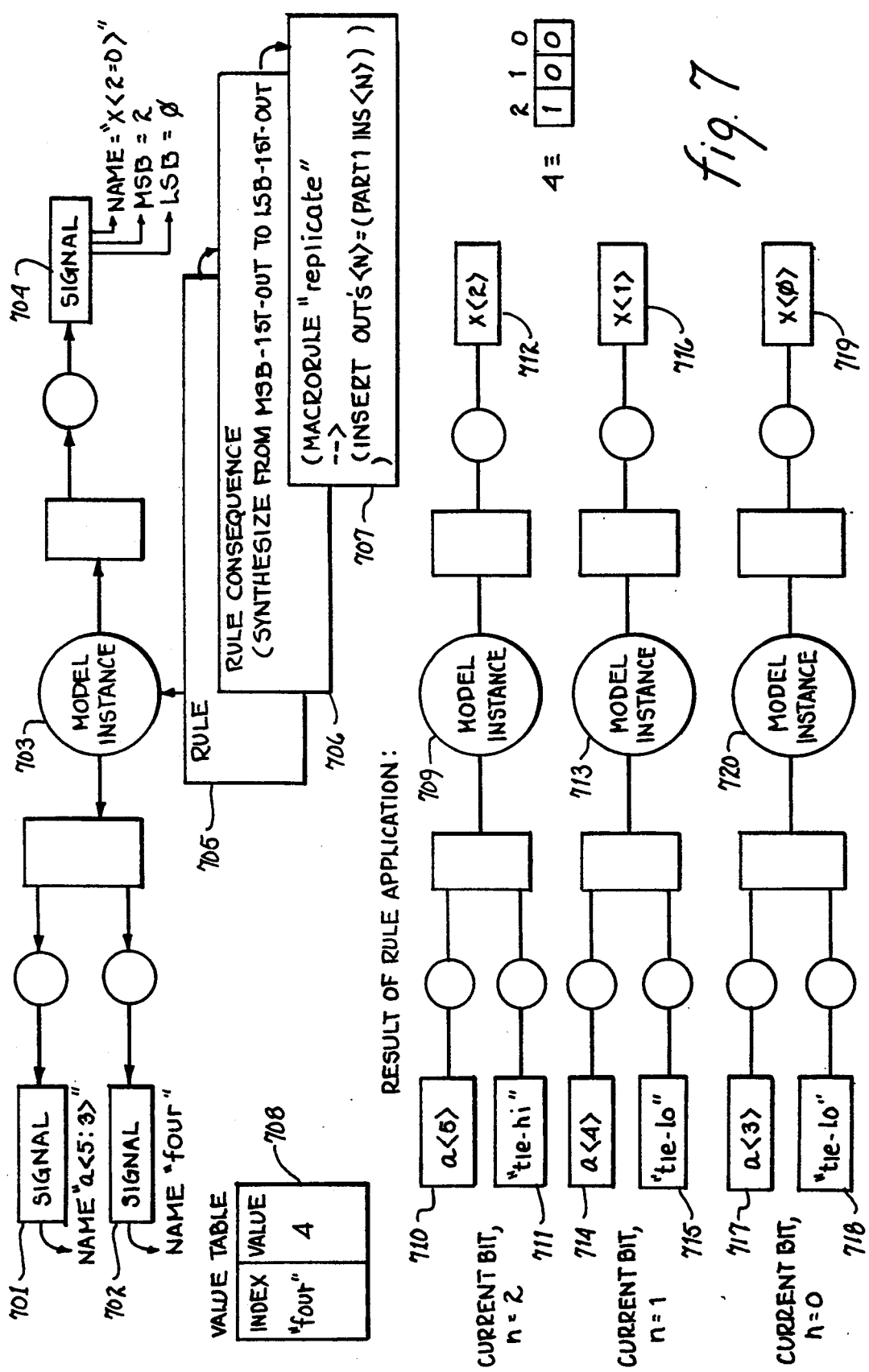
FIG. 7 is a diagram showing the replication of a multibit model instance according to the present invention.

Referring now to FIG. 7, a rule 705 is applied against a model instance 703. The model instance is coupled to an output signal 704 which has a most significant bit (MSB) 2 and a least significant bit (LSB) 0. The model instance is coupled to input signals 701 and 702. Signal 701 has a MSB 5 and a LSB 3. Signal 702 is in the value table 708 and therefore represents a constant 4. The rule consequence (synthesize from MSB-1st-out to LSB-1st-out <macrorule>) is interpreted. The computation MSB of first output minus LSB of first output plus 1 yields three, the number of iterations of the control loop. The current bit 'n' is set to 0 for the first iteration.

In each iteration, the macrorule 707 is interpreted to insert the equation outs<n>=(part—1 ins<n>). The first iteration therefore inserts a model instance 716 with an output signal "x" concatenated with the bit calculated by adding 'n' to the LSB 0 of the output 704 of the current model instance 703, therefore producing the signal 719 "x<0>". For the inputs, "a<3>" 717 is produced by concatenating "a" with 'n' plus the LSB of the first input 701. The signal "tie—lo" 718 is produced by taking the binary value of the bit position 'n'=0 of the number 4, corresponding to the value of the second input "four" 702. "Tie-lo" is a signal representing binary constant 0, while "tie-hi" is a signal representing binary constant 1. The second iteration inserts the instance 713 with outputs 716 and inputs 714 and 715. In this iteration, the current bit 'n' is 1. All signal bits relative to the current bit are now 1 higher than they were in the previous iteration. Note that bit 1 of the number 4 still yields "tie—lo". The third and last iteration inserts the instance 709 with outputs 712 and inputs 710 and 711. The current bit 'n' has been incremented to 2, and all signals produced have bit significance of the value of the current bit 2 plus their corresponding LSB from the instance 703 signals 701, 702 and 704.

Figure 8:
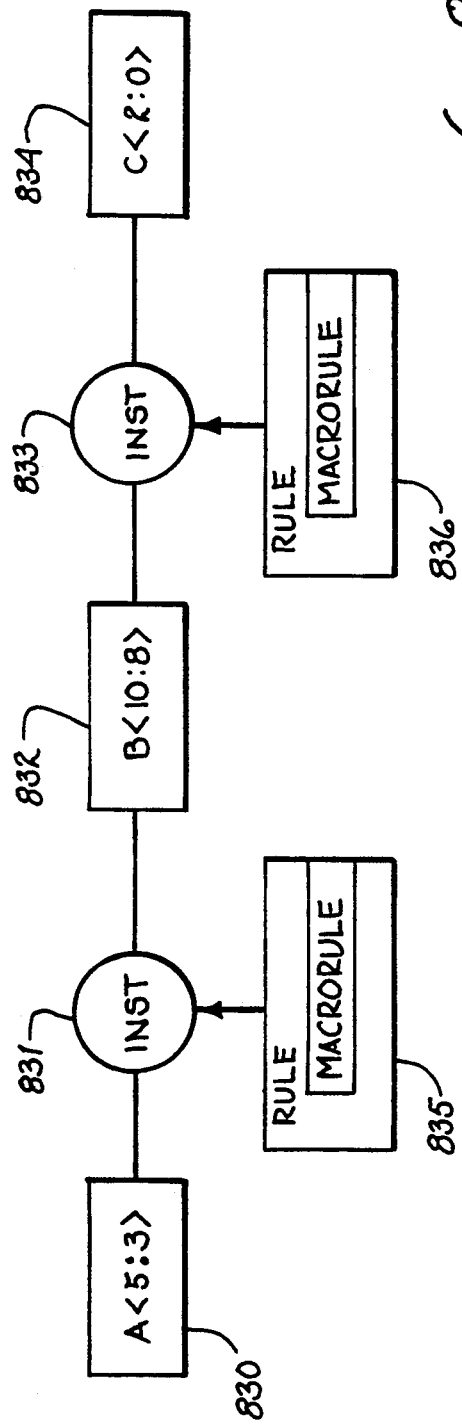
FIG. 8 is a diagram illustrating the action of two rules on separate multibit instances according to the present invention.
Figure 8:
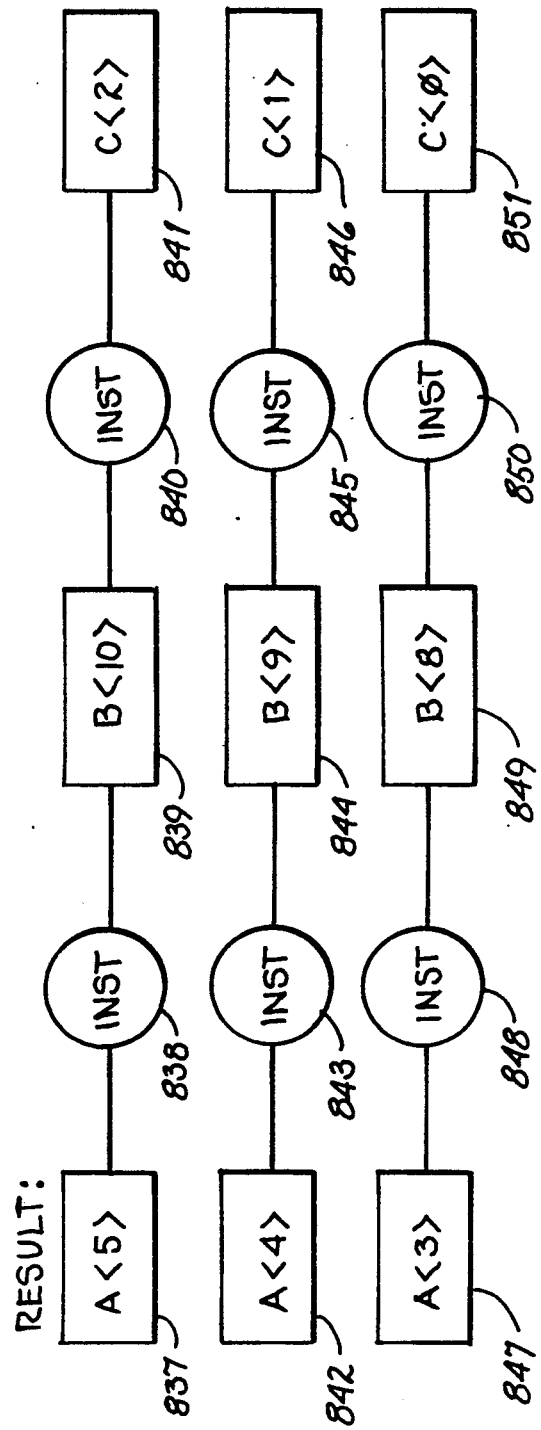

Referring now to FIG. 8, two multibit instances 831 and 833 have signal fields "A<5:3>" 830, "B<10:8>" 832 and "<2:0>" 834 associated therewith. The rules 835 and 836 are applied against the two instances. The first rule 835 to be applied creates and inserts instances 838, 843 and 848 with outputs to 839, 844 and 849 and inputs from 837, 842 and 847. The signals "B<10>", "B<9>" and "B<8>" did not previously exist and are therefore created. When the second rule 836 is applied, instances 840, 845 and 850 are created and inserted, with outputs to 841, 846 and 851. The input signals 839, 844 and 849 are found to already exist, therefore connection is made to the existing signals as described in U.S. Patent Application entitled "Rule Structure for Insertion of New Elements in a Circuit Design Synthesis Procedure".

Figure 9:
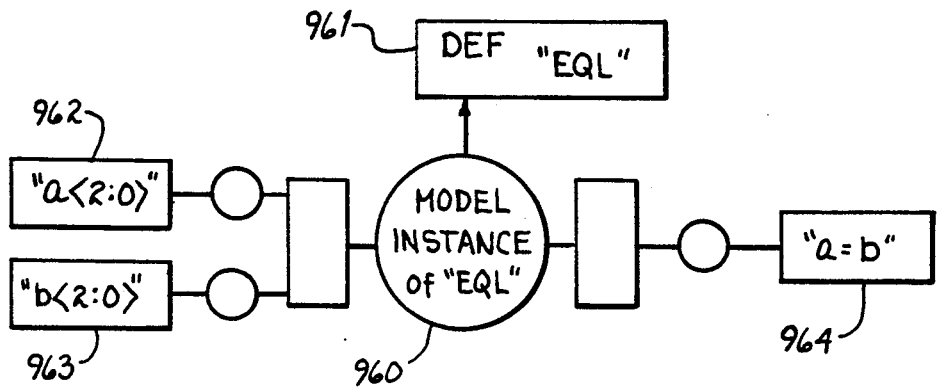
FIG. 9 is a diagram illustrating the synthesis of an 'EQL' operator.
Figure 9:
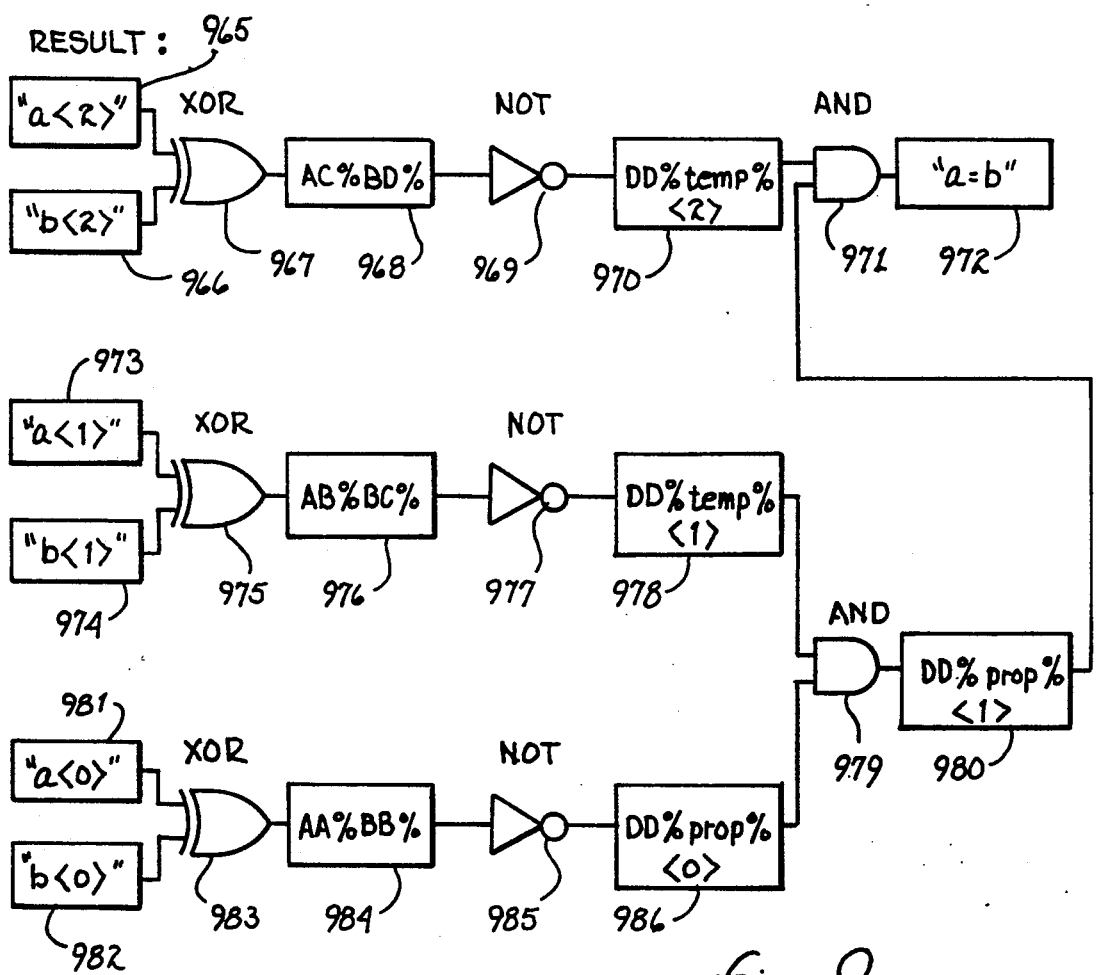

Referring next to FIG. 9, the synthesis of an instance 960 of high level model 'EQL' is illustrated. The definition of 'EQL' 961 described its functionality as having an output of 'true' if the binary values of two multibit input signals are equal. The rule to synthesize the instance 960 with output signal 964 and input signals 962 and 963 is as follows:

```
(p "expand eql"
(model is EQL)
(any width-signal-tag-ins is—greater—than 1)
(no names-signal-ins are "0")
→
(synthesize from msb-of-1st-tag
    to lsb-of-1st-tag
 (macrorule "output of eql"
    (<n> is <msb>)
    →
    (insert
      "temp%<n>" = (not (xor "ins<n>"))
      1st-out = (and "temp%<n>" "prop%<n-1>")
    )
 )
 (macrorule "middle stages for eql"
    (<n> is—greater—than <lsb>)
    (<n> is—less—than <msb>)
    →
    (insert
      "temp%<n>" = (not (xor "ins<n>"))
      "prop%<n>" = (and "temp%<n>" "prop%<n-1>")
    )
```

```
)
    (macrorule "first stage of eql"
        (<n> is <lsb>)
        →
        (insert "prop%<n>" = (not (xor "ins<n>")))
    )
)
(remove *instance*)
)
```

This rule, when applied produces bit-level instances and their interconnections as shown in FIG. 9. The 'synthesize' command specifies synthesis across the range of the MSB to LSB of the first input, in this case, causing three iterations. The first macrorule will be applied only if the current bit <n> is the <msb>, as indicated by the macrorule's antecedent. The second macrorule is applied only when the current bit <n> lies between the <lsb> and <msb>. The third macrorule will be applied only when the current bit <n> is the <lsb>. The first iteration of the control loop inserts the instances 983 and 985 with connectivity to signals 981, 982, 984 and 986, due to application of the third macrorule when current bit=LSB=0. The signals "a<0>" 981 and "b<0>" 982 correspond to the inputs 962 and 963 of the current model instance 960. The signal 984 is unique, derived from the equation nest, therefore having only one source 983 and one destination 985. The signal 986 is also unique, within the scope of the set of macrorules by virtue of the substring "DD%". The second iteration inserts instances 975, 977 and 979 with connectivity to signal 973, 974, 976, 978 and 980, due to application of the second macrorule. The signal named "prop%<n−1>" produces the identical signal name of "prop%<n>" of the previous iteration, therefore causing a connection 986 to the instance 979. The third iteration inserts instances 967, 969 and 971 with connectivity to signals 965, 966, 968, 970 and 972, due to application of the first macrorule when current bit=msb=2. The propagation of bit equal functionality is again continued by the use of "prop%<n−1>". The connection to the output signal "a=b" of the current model instance is finally established, completing the bit-level synthesis operation.

Figure 10:
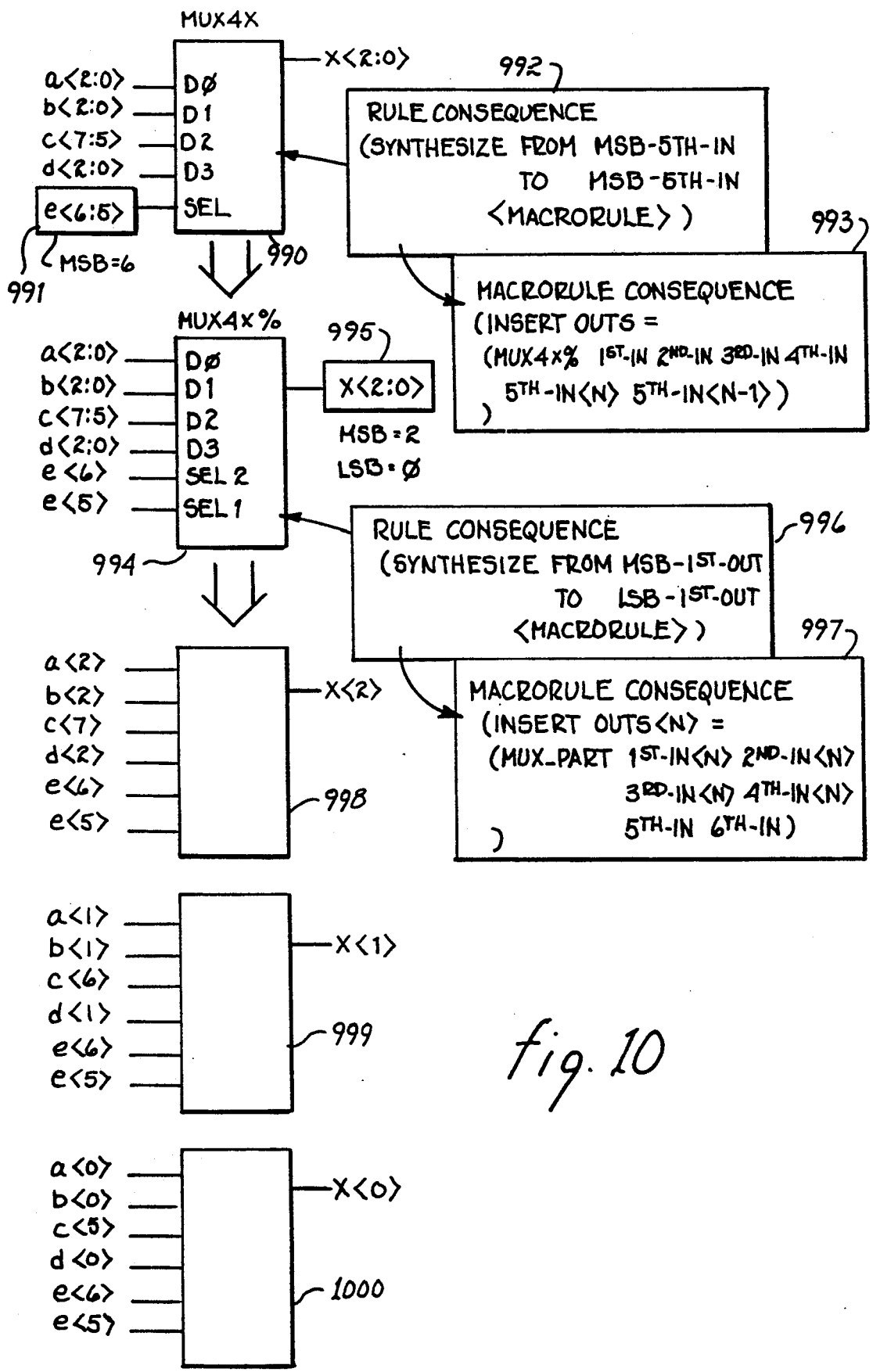
FIG. 10 is a diagram illustrating the synthesis of an instance where the multibit ports have unequal bit-ranges.

Referring next to FIG. 10, the synthesis of a multi-bit instance is which there are unequal MSB-to-LSB bit ranges is illustrated. A 'SEL' input signal is connected to a signal 991 with a range of 2 bits, and MSB=6. Functionally, the 'SEL' chooses one of the four data inputs to be steered to the output, based on its encoding. The four data inputs "a<2:0>", "b<2:0>", "C<7:5>", "d<2:0>" and the data output "x<2:0>" have a range of 3 bits. A rule with consequence 992 is selected. Only one iteration of the control loop occurs, since the 'FROM' and 'TO' values both refer to the MSB of the fifth input 991. A macrorule 993 creates a new instance 994 with single bit select inputs "e<6>" and "e<5>". This is accomplished by referring to the current bit through 5th-in<n> of the top instance in FIG. 10 and an offset to the current bit 5th-in<n−1> in the insertion statement of the macrorule 993. Later, the model instances 994 become the current instance, and another rule with consequence 996 is applied. The macrorule consequence 997 results in the insertion of instances 998, 999 and 900. Macrorule 997 selects the inputs "e<6>" and "e<5>" of the instance 994 by using the access forms 5th-in and 6th-in. Connection of bit level signals for data inputs a, b, c and d and outputs x is achieved by using the bracket <n> to identify bit position.

2. Operation of the Preferred Embodiment

The present invention provides a rule consequence form that permits not only simple instance generation at the bit level, but testing bit significance to selectively control a subset of rules called macrorules, and creation of special case connectivity between different bit positions. The present invention permits a variety of new types of synthesis to occur, involving generation of logic such as testable scan latch systems, comparators, incrementer, decrementers and shift registers.

The 'synthesize' command format is described in U.S. Patent Application entitled "Rule Structure In a Procedure for Synthesis of Logic Circuit Designs". When a rule is applied against a current model instance, the rule consequence in this case contains the statement:

(synthesize from <msb-access> to <lsb-access>
    <macrorules>)

At rule execution time, <msb-access> and <lsb-access> return numbers when evaluated. These are the most significant bit and the least significant bit of a selectively chosen signal/part associated with the current instance, respectively. The operation (MSB minus LSB plus 1) produces the number of iterations to occur in the synthesis control loop. The terms 'msb' and 'lsb' are local variables which remain constant for the duration of the control loop application. A current bit 'n' acts as a loop control variable and is assigned an initial value of 0, and incremented on each iteration. Each iteration, the full collection of macrorules are tested to find if their individual antecedents return a 'true' verdict. In addition to accessing the data base relative to the current model instance, the macrorules may access the values of the MSB, LSB and current bit 'n', and can compare the relationship between these numbers. For example, a macrorule can check whether the current bit is equal to MSB minus 1, and if so, insert special bit level functionality into the data base. Any macrorule within the scope of a 'parent' rule is eligible for application. There is no arbitration involved to chose a best macrorule. Instead, all macrorules with true verdicts are applied.

The macrorules can insert bit level instances with signal names containing bit position identifiers, called bit subscripts. The subscripts are contained in brackets as a standard of every synthesis system. Again the insertion equations can refer to the 'msb', 'lsb' and 'n', and numeric offsets of the same, for the creation of bit significant signal names. A reference to a port instance of the current instance such as 1st-output<n> implies that a signal will be created whose root name (non-bracketed option) is the same as that of the first output of the current model instance, with a bit 'n' subscript of current bit plus the least-significant bit of the first output. This flexibility allows complete freedom in the naming of the range of bits for multi-bit instances, and makes it easy to synthesize instances connected to bit fields of very large multi-bit signals.

Signal names which represent numeric constants are maintained in a value table. At signal access time for an equation insertion, the value of the signal name is retrieved from the value table. If the signal is a constant, a number is returned. The bit access, indicating a bit position relative to 'msb', 'lsb' or 'n' is evaluated to determine the correct bit position of the constant. The binary value of the bit position in the number determines whether a logical high, "tie-hi", (for 1) or a logical low, "tie-hi", (for 0) is to be connected.

Following the completion of the control loop, and the insertion of bit level model instances, the 'synthesize' antecedent form is usually followed by the statement (remove *instance*) to remove the current model instance from the data base. Thus transformation of a logic design from a high level representation to a more complex binary level representation is achieved.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A method of creating a plurality of bit-level model instances from higher level model instances for synthesizing circuit designs, the higher level model instances having at least one multi-bit port for receiving at least one multi-bit signal, the bit-level and higher level model instances being stored in a memory of a data processing system, the method comprising the steps of:

selecting for execution in the data processing system a rule having a consequence portion containing a macrorule, the macrorule being executed by the data processing system over a selected one of the bits of the multi-bit signal received by the multi-bit port;

executing in the data processing system a function of the selected macrorule for the selected one bit of the multi-bit signal in order to create a first one of the bit-level model instances; and repeating in the data processing system the steps of the selecting and executing the macrorule over a succeeding bit of the multi-bit signal using the preceding one of the bit level model instances to create a subsequent bit-level model instance.

2. The method of creating a plurality of bit-level model instances according to claim 1 wherein the rule is stored in the data processing system in a rule table in said memory, said rule table having a plurality of rules.

3. The method of creating a plurality of bit-level model instances according to claim 1 wherein the step of repeating occurs over a number of iterations corresponding to a value of the most significant bit minus the least significant bit of the multi-bit signal plus one.

4. A method of creating bit-level model instances from higher level model instances to synthesize circuit designs, the higher level model instances having at least one multi-bit port for receiving at least one multi-bit signal, the bit-level and higher level model instances being stored in a memory of a data processing system, the method comprising the steps of:

selecting in the data processing system a rule, the rule having an antecedent portion and a consequence portion, the consequence portion containing a macrorule which is executed in said data processing system in accordance with one of the bits of the multi-bit signal received by the multi-bit port;

determining in the data processing system whether a function of the macrorule should be executed in the data processing system for the selected one bit;

executing in the data processing system each determined function to be executed of the selected macrorule for the selected one bit to create a bit-level model instance; and repeating in the data processing system the steps of selecting, determining, and executing the macrorule for each subsequent bit of the multi-bit signal using the preceding bit level model instance to create a succeeding bit-level model instance.

5. The method of creating bit-level model instances from higher level model instances to synthesize circuit designs according to claim 4 wherein the rule is stored in the data processing system in a rule table having a plurality of rules and the rule table is stored in the memory of the data processing system in a rule base having a plurality of rule tables.

6. The method of creating bit-level model instances from higher level model instances to synthesize circuit designs according to claim 4 wherein the step of repeating occurs over a number of iterations corresponding to a value of the most significant bit minus the least significant bit of the multi-bit signal plus one.

7. The method of creating bit-level model instances from higher level model instances to synthesize circuit designs according to claim 4 wherein the antecedent portion of the rule is ignored.

* * * * *